US012609160B2

(12) United States Patent
Fang

(10) Patent No.: US 12,609,160 B2
(45) Date of Patent: Apr. 21, 2026

(54) RESISTANCE COMPENSATION DEVICE AND METHOD FOR STORAGE CHIP, AND STORAGE CHIP

(71) Applicant: ZHEJIANG HIKSTOR TECHNOLOGY CO., LTD., Hangzhou (CN)

(72) Inventor: Wei Fang, Hangzhou (CN)

(73) Assignee: ZHEJIANG HIKSTOR TECHNOLOGY CO., LTD., Hangzhou (CN)

( * ) Notice: Subject to any disclaimer, the term of this patent is extended or adjusted under 35 U.S.C. 154(b) by 207 days.

(21) Appl. No.: 18/575,264

(22) PCT Filed: Sep. 2, 2022

(86) PCT No.: PCT/CN2022/116776
§ 371 (c)(1),
(2) Date: Dec. 28, 2023

(87) PCT Pub. No.: WO2023/093193
PCT Pub. Date: Jun. 1, 2023

(65) Prior Publication Data
US 2024/0304242 A1 Sep. 12, 2024

(30) Foreign Application Priority Data
Nov. 24, 2021 (CN) .......................... 202111407324.3

(51) Int. Cl.
*G11C 13/00* (2006.01)

(52) U.S. Cl.
CPC ...... *G11C 13/0069* (2013.01); *G11C 13/0026* (2013.01); *G11C 13/0028* (2013.01); *G11C 13/0038* (2013.01)

(58) Field of Classification Search
CPC ............ G11C 13/0069; G11C 13/0026; G11C 13/0028; G11C 13/0038; G11C 5/14; G11C 7/18; G11C 8/10; G11C 8/14; G11C 13/00; G11C 13/003; G11C 13/004; G11C 5/147
See application file for complete search history.

(56) References Cited

U.S. PATENT DOCUMENTS

| | | | |
|---|---|---|---|
| 2015/0130531 A1 | 5/2015 | Tadinada | |
| 2016/0357205 A1* | 12/2016 | Sanasi | ..................... G05F 1/575 |
| 2019/0385678 A1* | 12/2019 | Gangasani | ......... G11C 13/0033 |

(Continued)

FOREIGN PATENT DOCUMENTS

| | | |
|---|---|---|
| CN | 1734674 A | 2/2006 |
| CN | 102157203 A | 8/2011 |

(Continued)

OTHER PUBLICATIONS

The first office action of counterpart CN application No. 2021114073243 issued on Jun. 23, 2025.

*Primary Examiner* — Jerome Leboeuf
(74) *Attorney, Agent, or Firm* — The Sun IP Law

(57) ABSTRACT

A compensation resistor is gated by arranging a compensation circuit switch to be gated in synchronization with the reception of a bit cell, and corresponding resistance compensation is performed on the bit cell which is gated by a total resistance value of a pre-designed compensation resistor array structure, and compensation resistor traces are sequentially connected in series into two metal wires.

16 Claims, 4 Drawing Sheets

(56)     References Cited

U.S. PATENT DOCUMENTS

| | | | |
|---|---|---|---|
| 2021/0096586 A1* | 4/2021 | Lin ........................ | H02M 3/155 |
| 2021/0166735 A1* | 6/2021 | Tang ...................... | G11C 16/30 |

FOREIGN PATENT DOCUMENTS

| | | |
|---|---|---|
| CN | 103222004 | 7/2013 |
| CN | 107705813 | 2/2018 |
| CN | 110660434 | 1/2020 |
| CN | 110729012 A | 1/2020 |
| CN | 111755037 A | 10/2020 |
| CN | 112309472 A | 2/2021 |

* cited by examiner

Trace length of Low Dropout Regulator (LDO)

Compensator resistor in direction of
horizontal axis

RESISTANCE COMPENSATION DEVICE AND METHOD FOR STORAGE CHIP, AND STORAGE CHIP

CROSS-REFERENCE TO RELATED APPLICATION

The application claims priority to Chinese Patent Application No. 202111407324.3, filed to the China National Intellectual Property Administration on Nov. 24, 2021 and entitled "Resistance Compensation Device and Method for Storage Chip, and Storage Chip", the disclosure of which is hereby incorporated by reference in its entirety.

TECHNICAL FIELD

The disclosure relates to the technical field of storage, and in particular to a resistance compensation device and method for a storage chip, and a storage chip.

BACKGROUND

In a storage chip, a Low Dropout Regulator (LDO) is usually used to provide a unified power supply for bit cells in a bit cell array. Due to different trace lengths from a voltage output end of the LDO to each bit cell, under the effect of the trace resistance, the bit cell farther away from the LDO (hereinafter referred to as the "far-end bit cell") has a lower voltage than the bit cell closer to the LDO (hereinafter referred to as the "near-end bit"). In order to ensure that the far-end bit cell has enough voltage to ensure a read-write success rate, it is necessary to increase the voltage output of the LDO.

However, the read-write service life of the chip is sensitive to the voltage, and too high voltage will reduce the read-write service life of the chip. FIG. 1 is a diagram showing a correspondence between a failure rate of the bit cell and the trace length from the bit cell to the LDO under the same write times. As shown in FIG. 1, tests showed that in the current storage chip, the service life of the near-end bit cell of the LDO is significantly lower than that of the far-end bit cell of the LDO.

In this regard, technicians have proposed a method of performing compensation on each bit cell by means of compensation resistors, which specifically by collecting circuit parameters (voltage or current) in the bit cell array by means of arranging a sampling circuit, calculating a compensation value according to the circuit parameters of the bit cell array, and adjusting resistance value of the compensation resistors to balance the voltages of the bit cells. However, this method requires an additional sampling circuit and a compensation resistor circuit, and the circuit structure is complex, which is not conducive to the miniaturization of a device. Moreover, this method has large delay on compensation control and is difficult to obtain high compensation precision.

SUMMARY

The purpose of the disclosure is to provide a resistance compensation device and method for a storage chip, and a storage chip.

The disclosure provides a resistance compensation device for a storage chip, and the resistance compensation device has a compensation resistor array structure composed of a plurality of compensation resistors and a plurality of compensation circuit switches;

the compensation resistor array structure is arranged between a bit cell power output end of the storage chip and a preset power supply end of a bit cell array of the storage chip; and the plurality of the compensation circuit switches are arranged corresponding to bit cells in the bit cell array; and the compensation circuit switch and the bit cell correspondingly are synchronously gated and synchronously turned off, so as to synchronously change a total resistance value of the compensation resistor array structure to perform corresponding resistance compensation on the bit cell which is gated.

Optionally, the compensation circuit switch and the bit cell correspondingly are synchronously gated and synchronously turned off, so as to synchronously change the total resistance value of the compensation resistor array structure to perform the corresponding resistance compensation on the bit cell which is gated specifically includes:

the compensation circuit switch and the bit cell correspondingly are synchronously gated and synchronously turned off, so that the total trace resistance from the bit cell power output end to the bit cell which is gated is consistent in a case that the bit cell is selected.

Optionally, compensation resistor traces are sequentially connected in series into two or more metal wires; and the metal wires are connected to each other through the plurality of the compensation circuit switches.

Optionally, the number of the metal wires is specifically two.

Optionally, the plurality of the compensation circuit switches are in one-to-one correspondence with gating signal lines of the bit cell array.

Optionally, the bit cell array is specifically a two-dimensional array, and the gating signal lines specifically include x+1 bit lines in a direction of a horizontal axis and y+1 word lines in a direction of a vertical axis; and from the bit cell power output end, the plurality of the compensation circuit switches corresponding to the bit lines are sequentially connected between the two metal lines according to an arrangement order opposite to that of the bit lines from the bit cell power output end; and from the bit cell power output end, the plurality of the compensation circuit switches corresponding to the word lines are sequentially connected between the two metal lines according to an arrangement order opposite to that of the word lines from the bit cell power output end; and x and y are positive integers, and in a direction of a same axis, a sum of resistance values of two sections of the compensation resistor traces between any two of the plurality of the compensation circuit switches is equal to a trace resistance value between two of the gating signal lines correspondingly.

Optionally, each of the plurality of the compensation circuit switches is connected to a control end of the gating signal line correspondingly.

Optionally, the resistance compensation device further includes a first decoder, a second decoder, a third decoder, and a fourth decoder; and an input end of the first decoder and an input end of the second decoder are connected to a same set of bit line control pins, an output end of the first decoder is connected to a bit line gating switch of each of the bit lines, an output end of the second decoder is connected to the compensation circuit switch corresponding to each of the bit lines, and a control signal decoding sequence output by the second decoder is opposite to that of the first decoder; and an input end of the third decoder and an input end of the fourth decoder are connected to a same set of word line control pins, an output end of the third decoder is connected to a word line gating switch of each of the word lines, an output end of the fourth decoder is connected to the compensation circuit switch corresponding to each of the word lines, and a control signal decoding sequence output by the fourth decoder is opposite to that of the third decoder.

Optionally, the compensation circuit switch is specifically a Metal Oxide Semiconductor (MOS) transistor.

Optionally, the bit cell power output end is specifically an output end of a linear regulator or an output end of an operational amplifier; and a voltage provided by the bit cell power output end is specifically a read operation voltage to the bit cell array or a write operation voltage to the bit cell array.

The disclosure further provides a storage chip, which includes any one of the above resistance compensation devices for the storage chip.

The disclosure further provides a resistance compensation method for a storage chip, applied to a compensation resistor array structure composed of a plurality of compensation resistors and a plurality of compensation circuit switches, the compensation resistor array structure is arranged between a bit cell power output end of the storage chip and a preset power supply end of a bit cell array of the storage chip, the plurality of the compensation circuit switches are arranged corresponding to bit cells in the bit cell array, and the resistance compensation method includes:

in a case that a first control signal of the bit cell is generated, a second control signal of the compensation circuit switch corresponding to the bit cell is generated; and the first control signal and the second control signal are synchronously sent to perform corresponding resistance compensation on the bit cell which is gated by a total resistance value of the compensation resistor array structure controlled by the second control signal.

The disclosure further provides a resistance compensation method for a storage chip and a storage chip.

BRIEF DESCRIPTION OF THE DRAWINGS

In order to more clearly illustrate the embodiments of the disclosure or the technical solutions in the related art, the drawings used in the description of the embodiments or the related art will be briefly described below. It is apparent that the drawings described below are only some embodiments of the disclosure. Other drawings may further be obtained by those of ordinary skill in the art according to these drawings without creative efforts.

DETAILED DESCRIPTION OF THE EMBODIMENTS

The core of the disclosure is to provide a resistance compensation device and method for a storage chip, and a storage chip, which can perform faster resistance compensation having higher precision on bit cells on the storage chip, balance voltages of the bit cells, and better save the space of the chip compared with existing compensation solutions, thereby reducing the cost of the chip.

The technical solutions in the embodiments of the disclosure will be clearly and completely described in conjunction with the drawings in the embodiments of the disclosure. It is apparent that the described embodiments are only a part of the embodiments of the disclosure, and not all of them. All other embodiments obtained by those of ordinary skill in the art on the basis of the embodiments in the disclosure without creative work shall fall within the scope of protection of the disclosure.

Embodiment 1

Figure 1:
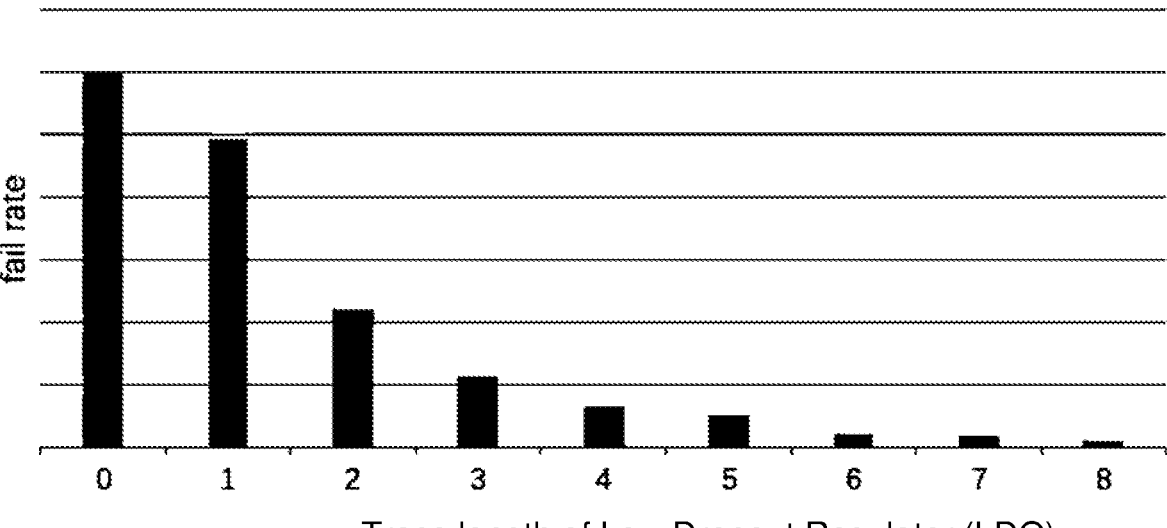
FIG. 1 is a diagram showing a correspondence between a failure rate of a bit cell and a trace length from a bit cell to an LDO under the same write times.
Figure 2:
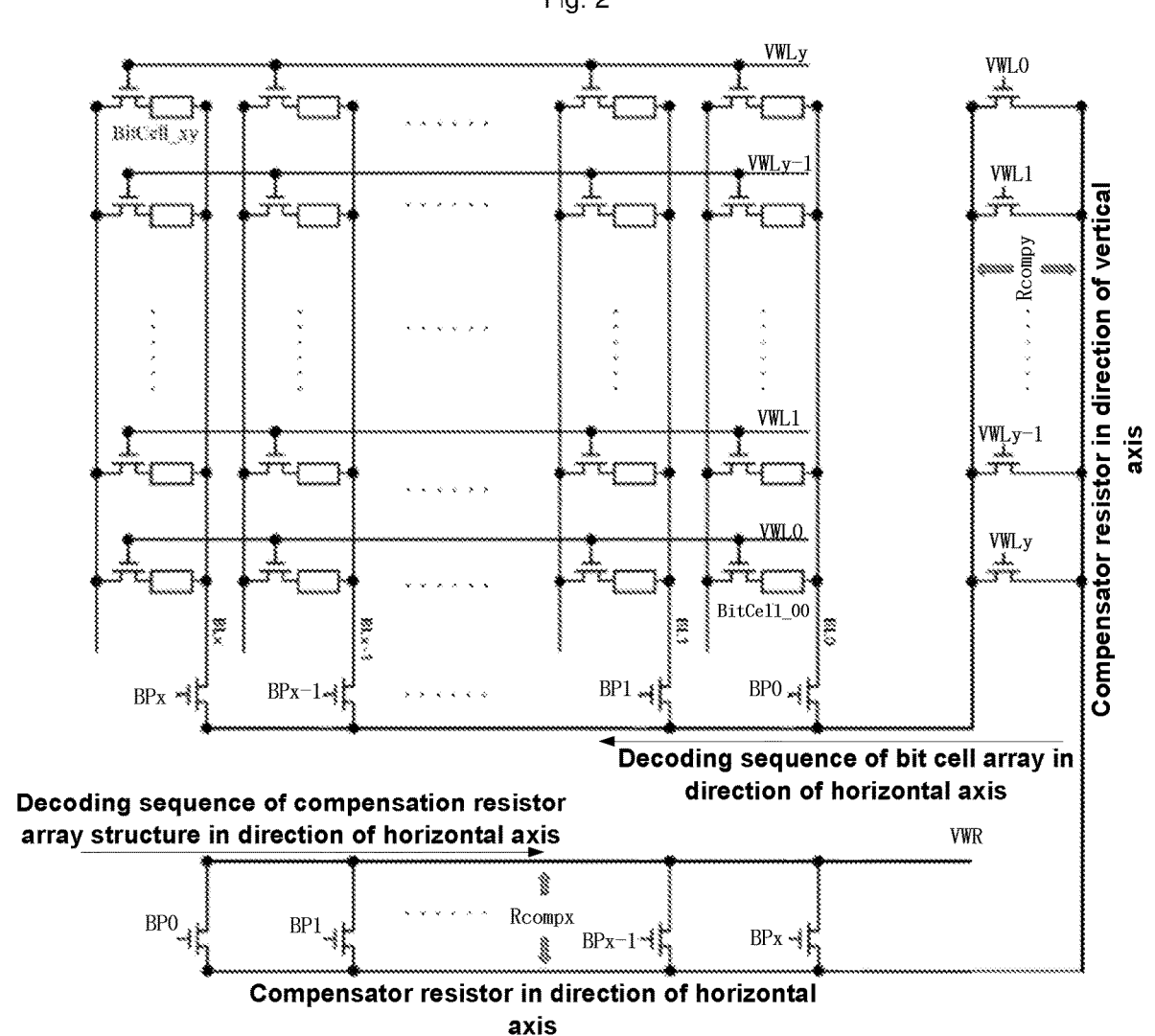
FIG. 2 is a schematic structural diagram of a resistance compensation device for a first type of storage chip according to an embodiment of the disclosure.

FIG. 2 is a schematic structural diagram of a resistance compensation device for a first type of a storage chip according to an embodiment of the disclosure.

As shown in FIG. 2, a two-dimensional bit cell array having x+1 bit lines and y+1 word lines is taken as an example, the bit lines thereof include BL0, BL1, . . . . Blx−1, BLx, corresponding bit line gating signals are BP0, BP1, . . . . BPx−1, BPx, and each bit line gating signal respectively inputs a gate of a bit line gating switch on the corresponding bit line. The word lines include VWL0, VWL1, . . . . VWLy−1, VWLy, corresponding word line gating signals are VWL0, VWL1, . . . . VWLy−1, VWLy, and each word line gating signal respectively inputs a gate of a word line gating switch on the corresponding word line. When one bit line and one word line are simultaneously gated, only one bit cell is gated, thereby realizing the gating of the bit cells BitCell_00 to BitCell_xy in the two-dimensional bit cell array. In addition, a three-dimensional bit cell array is also provided, which adds gating signal lines in a direction of a vertical axis on the basis of the bit lines in a direction of a horizontal axis and the word lines in the direction of the vertical axis.

For the bit cell array, embodiments of the disclosure provide a resistance compensation device for a storage chip, having a compensation resistor array structure composed of a plurality of compensation resistors and a plurality of compensation circuit switches.

The compensation resistor array structure is arranged between a bit cell power output end of the storage chip and a preset power supply end of a bit cell array of the storage chip.

The plurality of the compensation circuit switches are arranged corresponding to bit cells in the bit cell array.

The compensation circuit switch and the bit cell correspondingly are synchronously gated and synchronously turned off, so as to synchronously change a total resistance value of the compensation resistor array structure to perform corresponding resistance compensation on the bit cell which is gated.

It is to be noted that the resistance compensation device for the storage chip provided by the embodiments of the disclosure is not limited to the structure shown in FIG. 2.

Preferably, the compensation circuit switch and the bit cell correspondingly are synchronously gated and synchronously turned off, so as to synchronously change the total resistance value of the compensation resistor array structure to perform corresponding resistance compensation on the bit cell which is gated specifically includes that: the compensation circuit switch and the bit cell correspondingly are synchronously gated and synchronously turned off, so that the total trace resistance from the bit cell power output end to the bit cell which is gated is consistent in a case that the bit cell is selected.

It is understandable that when the bit cell (such as BitCell_xy in FIG. 2) farthest away from the bit cell power output end (such as VWR shown in FIG. 2) is gated, the trace resistance between the bit cell and a voltage input end (such as a drain of the bit line gating switch corresponding to the bit line gating signal BP0 shown in FIG. 2) of the bit cell array is the largest. Similarly, when the bit cell (such as BitCell_00 in FIG. 2) closest to the bit cell power output end is gated, the trace resistance between the bit cell and the voltage input end (such as the drain of the bit line gating switch corresponding to the bit line gating signal BP0 shown in FIG. 2) of the bit cell array is the smallest. Therefore, the maximum trace resistance and the minimum trace resistance in the bit cell array are determined. A difference between the trace resistance corresponding to each bit cell and the maximum trace resistance, that is, a resistance value of each bit cell to be compensated, is obtained by means of sequential simulation measurement or by means of performing estimation according to the maximum trace resistance, the minimum trace resistance, and an arrangement manner of the bit cells. According to the resistance compensation device for the storage chip provided by the embodiments of the disclosure, the compensation resistor array structure arranged between the bit cell power output end and the voltage input end of the bit cell array can change the resistance value in synchronization with each bit cell, thereby compensating for the resistance value of each bit cell to be compensated accordingly. When each bit cell is gated, the corresponding compensation circuit switch is also synchronously gated, so that the total resistance value of the compensation resistor array structure is exactly the resistance value of the bit cell to be compensated, thereby achieving the purpose of enabling the total trace resistance from the bit cell power output end to the bit cell which is gated to be consistent when each bit cell is selected.

In some embodiments, a correspondence between the compensation circuit switch and the bit cell may be one-to-one, one-to-many or many-to-one, which may be formulated according to the physical space, cost and resistance compensation precision of the storage chip. In a case of the maximum resistance compensation precision, each bit cell uniquely corresponds to a gating mode of the compensation resistor array structure. If the resistance compensation precision is not high, the plurality of adjacent bit cells may correspond to the gating mode of the same compensation resistor array structure.

The compensation resistor may be in the form of a metal wire, a chip resistor or a combination of different types of compensation resistors, which may be specifically adaptively designed according to the physical space, cost and resistance compensation precision of the storage chip.

The compensation circuit switch is realized by an electronic control switch tube such as an MOS transistor, or other switching elements such as a relay and an Insulated Gate Bipolar Transistor (IGBT).

The bit cell power output end in the disclosure is specifically an output end of a linear regulator or an output end of an operational amplifier.

A voltage provided by the bit cell power output end may specifically be a read operation voltage to the bit cell array or a write operation voltage to the bit cell array.

The linear regulator may specifically be an LDO.

By applying the resistance compensation device for the storage chip provided by the disclosure, compared with a control solution of performing sampling by a sampling circuit and then adjusting the compensation resistor in the related art, the sampling circuit is not required, and the effect of synchronous compensation is achieved, that is, the trace resistance of the bit cell is compensated while the bit cell is gated, so that the space of the chip is saved, and then the cost of the chip is reduced. Moreover, there is more space for designing a more refined compensation resistor step, thereby realizing faster resistance compensation having higher precision, balancing the voltages of the bit cells, and avoiding the contradiction of a read-write failure caused by the voltage of the far-end bit cell being insufficient and the reduction of the service life caused by the voltage of the near-end bit cell being too high.

Embodiment 2

On the basis of the above embodiment, as shown in FIG. 2, the compensation resistor specifically uses compensation resistor traces to connect the plurality of the compensation circuit switches, and the compensation resistor traces are sequentially connected in series into two or more metal wires. The metal wires are connected to each other through the plurality of the compensation circuit switches, so that different compensation resistor traces are short-circuited after the compensation circuit switch is gated.

It is to be noted that in the above solution, the compensation resistor traces are sequentially connected in series into the two metal wires, and the two metal wires are not complete, but as shown in FIG. 2, the compensation resistor traces are divided into two sets of connection wires to connect both ends of the compensation circuit switch. The compensation resistor traces and the plurality of the compensation circuit switches constitute a ladder-shaped compensation resistor array structure.

In addition, the compensation resistor traces are sequentially connected in series into more than two metal wires, and then the compensation resistor traces in a longitudinal direction and the plurality of the compensation circuit switches in a horizontal direction constitute a checkerboard-shaped compensation resistor array structure. The sum of the resistance values of the adjacent compensation resistor traces in the horizontal direction should be equal to the resistance value of the single section of the gating signal line of the bit cell corresponding to each compensation circuit switch in the horizontal direction. For example, as shown in FIG. 2, the sum of the resistance values of the two compensation resistor traces in the compensation resistor array structure is equal to the resistance value of the single section of the gating signal line in the bit cell array.

On this basis, the adjacent compensation circuit switches in the horizontal direction may not be connected to the same connection point.

In addition, the compensation resistor array structure is not limited to a planar structure, but may also be a three-dimensional structure. When the bit cell array is of the three-dimensional structure, the compensation resistor array structure may be a two-dimensional structure as shown in FIG. 2 or the three-dimensional structure to adapt to different application scenarios corresponding to different bit cell array structures and different resistance compensation precision.

Embodiment 3

On the basis of the above embodiments, as shown in the circuit of the compensation resistor array structure in FIG. 2, if the number of metal wires is specifically two, that is, the compensation resistor traces and the plurality of the compensation circuit switches constitute the ladder-shaped compensation resistor array structure, the plurality of the compensation circuit switches are arranged to be in one-to-one correspondence with the gating signal lines of the bit cell array. That is, if the bit cell array is the two-dimensional array, the number of the compensation circuit switches is equal to the sum of the number of bit lines and the number of word lines. If the bit cell array is the three-dimensional array, the number of the compensation circuit switches is the sum of the number of bit lines and the number of word lines plus the number of gating signal lines in the direction of the vertical axis.

Of course, if the space and cost of the storage chip are limited and the requirement for the resistance compensation precision is not high, the adjacent bit cells may be arranged corresponding to the same compensation circuit switch, and the compensation circuit switch and the gating signal lines of the bit cell array may also be in a one-to-many relationship.

Embodiment 4

On the basis of the above embodiments, the embodiment of the disclosure is further illustrated by taking one-to-one correspondence between the plurality of the compensation circuit switches and the gating signal lines of the bit cell array as example. At this time, the specific correspondence between the compensation circuit switch and the gating signal line of the bit cell array is related to the arrangement of a synchronization control signal of the compensation circuit switch.

As shown in FIG. 2, the bit cell array is specifically a two-dimensional array, and the gating signal lines specifically includes x+1 bit lines in a direction of a horizontal axis and y+1 word lines in a direction of a vertical axis.

From the bit cell power output end, the plurality of the compensation circuit switches corresponding to the bit lines are sequentially connected between the two metal lines according to an arrangement order opposite to that of the bit lines from the bit cell power output end.

From the bit cell power output end, the plurality of the compensation circuit switches corresponding to the word lines are sequentially connected between the two metal lines according to an arrangement order opposite to that of the word lines from the bit cell power output end.

And, x and y are positive integers, and in a direction of a same axis, a sum of resistance values of two sections of the compensation resistor traces between any two of the plurality of the compensation circuit switches is equal to a trace resistance value between two of the gating signal lines correspondingly.

In FIG. 2, the same gating signal indicates the correspondence between the gating signal line (gating switch) and the compensation circuit switch. Specifically, as shown in FIG. 2, from the bit cell power output end, according to a descending order of the sequence numbers of the bit lines, the compensation circuit switches corresponding to the bit lines (that is, the compensation circuit switches corresponding to the bit line gating signals BPx, BPx−1, . . . . BP1, BP0) are sequentially connected between the two metal wires.

From the voltage input end of the bit cell array, according to a descending order of the sequence numbers of the word lines, the compensation circuit switches corresponding to the word lines (that is, the compensation circuit switches corresponding to word line gating signals VWLy, VWLy−1, . . . . VW1, VWL0) are sequentially connected between the two metal wires.

A preset voltage input end of the bit cell array is a drain of the bit line gating switch corresponding to the first bit line (that is, the gating signal switch corresponding to BP0). The smaller the sequence number of the word line, the closer the corresponding word line is to the voltage input end of the bit cell array.

In practical applications, the arrangement may also be performed according to an order opposite to that of the sequence numbers as shown in FIG. 2.

Based on the structure of the resistance compensation device as shown in FIG. 2, an address decoding direction of the compensation resistor array structure is opposite to that of the gating signal line after sorting according to the correspondence (for example, starting from the sequence number 0 and arranging from small to large). For example, when the a-th bit cell in the direction of the horizontal axis of the bit cell array is gated, that is, the bit line BPa is gated, the (x-a)-th compensation circuit switch in the compensation resistor (Rcompx) in the direction of the horizontal axis in the resistance compensation array structure is gated. The control manner of the compensation resistor (Rcompy) in the direction of the horizontal axis in the resistance compensation array structure is the same.

As mentioned in the above embodiments, the sum of the resistance values of the two compensation resistor traces circled in the compensation resistor array structure in FIG. 2 is equal to the resistance value of the single section of the gating signal line circled in the bit cell array, then preferably, a metal wire made of the same material as that in the bit cell array may be used as the compensation resistor trace, according to a resistor formula R=ρL/S (R is a resistor, p is a resistivity, L is a length, and S is a cross-sectional area), the length of the compensation resistor trace is arranged to be consistent to the length of the corresponding single section of the gating signal line, and the cross-sectional area of the compensation resistor trace is 2 times the cross-sectional area of the single section of the gating signal line, so that the compensation resistor array structure and the bit cell array have similar structures and realize high-precision resistance compensation.

Embodiment 5

Figure 3:
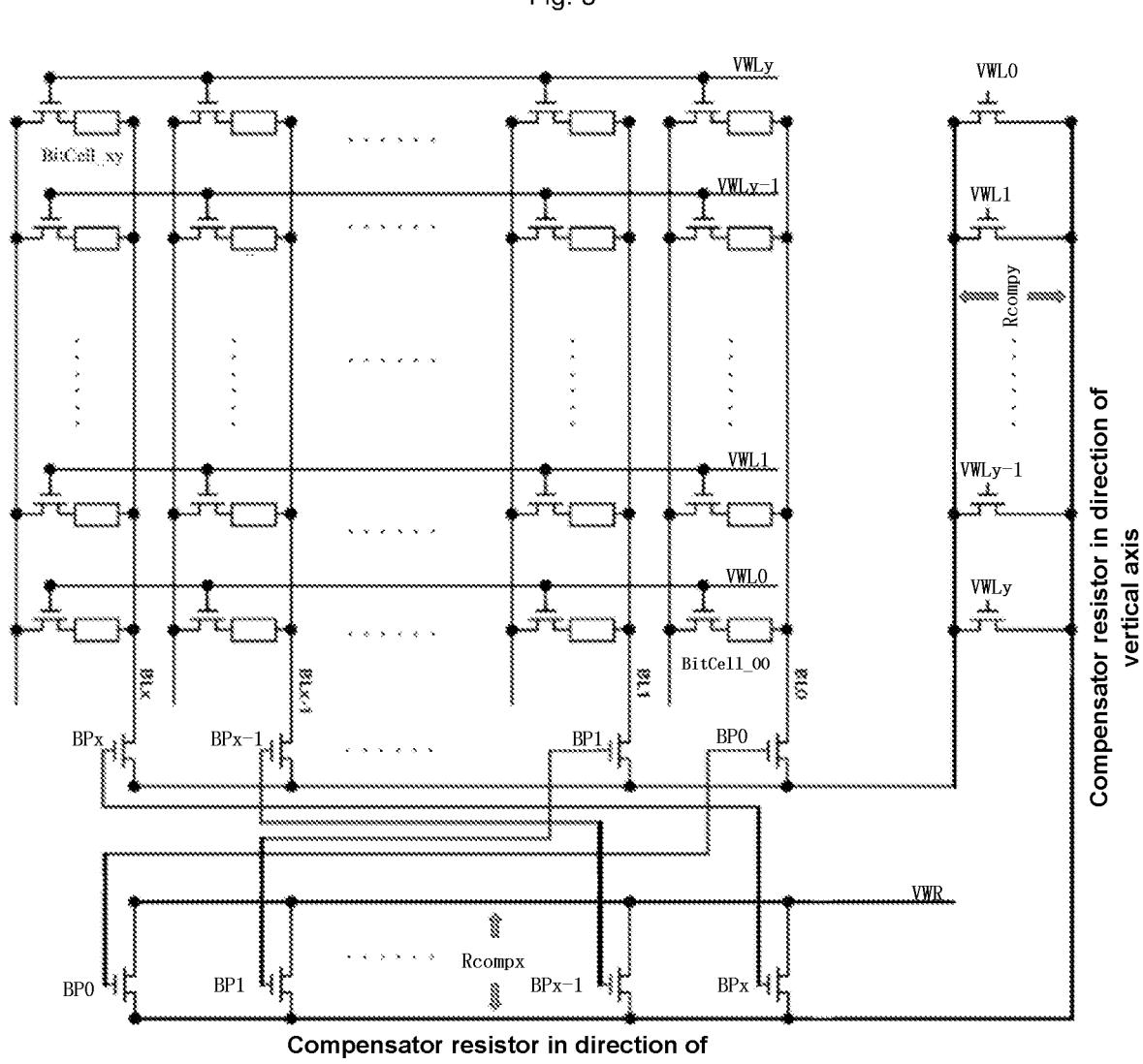
FIG. 3 is a schematic structural diagram of a resistance compensation device for a second type of storage chip according to an embodiment of the disclosure.

FIG. 3 is a schematic structural diagram of a resistance compensation device for a second type of a storage chip according to an embodiment of the disclosure.

On the basis of the above embodiments, in the resistance compensation device for the storage chip provided by the embodiments of the disclosure, as shown in FIG. 3, each compensation circuit switch is connected to a control end of the corresponding gating signal line.

On the basis of the above Embodiment 4, the compensation circuit switch is directly connected to the control end of the gating signal line of the corresponding sequence number (that is, the drain of the bit line gating switch on the bit line, and the gate of the word line gating switch on the word line), so that the control end of the compensation circuit switch and the control end of the gating signal line of the corresponding sequence number are directly connected to the same control pin of a controller, thereby achieving the control effect that the address decoding direction of the compensation resistor array structure is opposite to the address decoding direction of the gating signal line, and achieving the purpose of the required resistance compensation.

Embodiment 6

Figure 4:
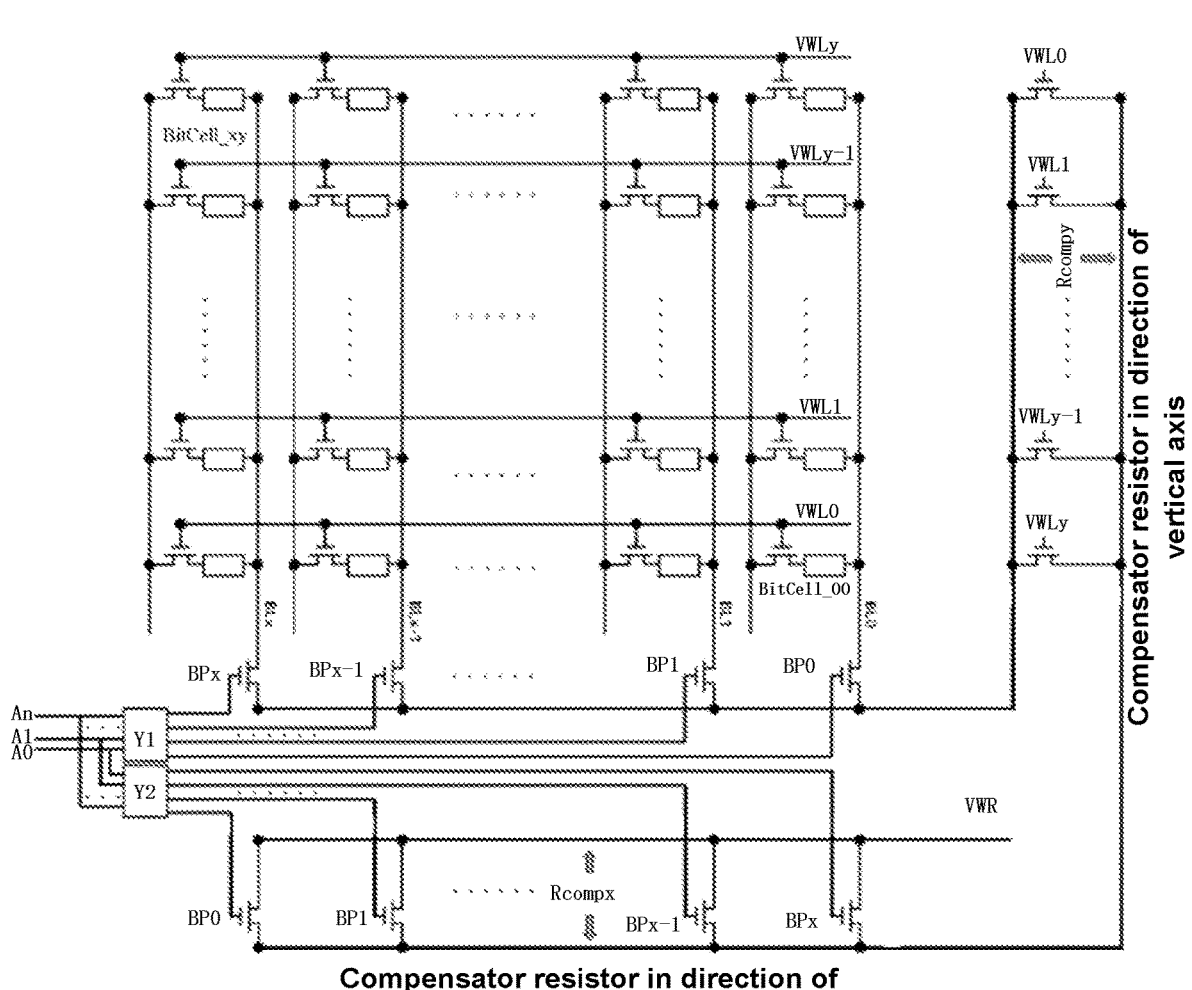
FIG. 4 is a schematic structural diagram of a resistance compensation device for a third type of storage chip according to an embodiment of the disclosure.

FIG. 4 is a schematic structural diagram of a resistance compensation device for a third type of a storage chip according to an embodiment of the disclosure.

On the basis of the above embodiments, as shown in FIG. 4, the resistance compensation device for the storage chip provided by the embodiment of the disclosure further includes a first decoder, a second decoder, a third decoder, and a fourth decoder.

An input end of the first decoder and an input end of the second decoder are connected to a same set of bit line control pins, an output end of the first decoder is connected to a bit line gating switch of each of the bit lines, an output end of the second decoder is connected to the compensation circuit switch corresponding to each of the bit lines, and a control signal decoding sequence output by the second decoder is opposite to that of the first decoder.

An input end of the third decoder and an input end of the fourth decoder are connected to a same set of word line control pins, an output end of the third decoder is connected to a word line gating switch of each of the word lines, an output end of the fourth decoder is connected to the compensation circuit switch corresponding to each of the word lines, and a control signal decoding sequence output by the fourth decoder is opposite to that of the third decoder.

On the basis of the above Embodiment 4, the control effect that the address decoding direction of the compensation resistor array structure is opposite to the address decoding direction of the gating signal line is also be achieved by arranging the decoders with the opposite decoding directions. For example, as shown in FIG. 4, the same set of bit line control pins A0, A1, . . . . An on the controller are also connected to the input end of the first decoder Y1 and the input end of the second decoder Y2, and the difference is that input end pins of the first decoder Y1 are connected to the bit line control pins A0, A1, . . . . An in reverse order, and input end pins of the second decoder Y2 are connected to the bit line control pins A0, A1, . . . . An in positive order. Output end pins of the first decoder Y1 sequentially correspond to the bit line gating signals BPx, BPx–1, . . . BP1, BP0 in the bit cell array, and output end pins of the second decoder Y2 sequentially correspond to the control signals BPx, BPx–1, . . . . BP1, BP0 of the compensation circuit switch in the resistance offset compensation (Rcompx) in the direction of the horizontal axis in the resistance compensation array structure.

The connection rules of the third decoder and the fourth decoder are referred to the above description, which will not be elaborated herein.

The embodiments corresponding to the resistance compensation device for the storage chip are described in detail above. On this basis, the disclosure further discloses a storage chip corresponding to the resistance compensation method for the storage chip and a resistance compensation method for the storage chip.

Embodiment 7

A storage chip provided by the embodiment of the disclosure may include the resistance compensation device for the storage chip provided by any of the above embodiments.

Since the embodiment of the storage chip part and the embodiment of the resistance compensation device part for the storage chip correspond to each other, the embodiment of the storage chip part and the description of the embodiment of the resistance compensation device part for the storage chip may be referred to each other, which will not be elaborated herein.

Embodiment 8

The embodiments of the disclosure provide a resistance compensation method for a storage chip, applied to a compensation resistor array structure composed of a plurality of compensation resistors and a plurality of compensation circuit switches. The compensation resistor array structure is arranged between a bit cell power output end of the storage chip and a preset power supply end of a bit cell array of the storage chip. The plurality of the compensation circuit switches are arranged corresponding to bit cells in the bit cell array. The resistance compensation method includes the following operations.

In a case that a first control signal of the bit cell is generated, a second control signal of the compensation circuit switch corresponding to the bit cell is generated.

The first control signal and the second control signal are synchronously sent to perform corresponding resistance compensation on the bit cell which is gated by a total resistance value of the compensation resistor array structure controlled by the second control signal.

Since the embodiment of the resistance compensation method part for the storage chip and the embodiment of the resistance compensation device part for the storage chip correspond to each other, the embodiment of the resistance compensation method part for the storage chip and the description of the embodiment of the resistance compensation device part for the storage chip may be referred to each other, which will not be elaborated herein.

The resistance compensation device and method for the storage chip, and the storage chip provided by the disclosure are described in detail above. The various embodiments in the present specification are described in a progressive manner, and each embodiment focuses on differences from other embodiments, and the same similar parts between the various embodiments can be referred to each other. For the resistance compensation method for the storage chip and the storage chip disclosed in the embodiment, since they correspond to the resistance compensation device for the storage chip disclosed in the embodiment, the description is relatively simple, and the relevant parts can be referred to the resistance compensation device part for the storage chip. It is to be noted that a number of improvements and modifications may be also made to the disclosure by those of ordinary skill in the art without departing from the principle of the disclosure, and all fall within the scope of protection of the claims of the disclosure.

It is also to be noted that relational terms "first", "second" and the like in the specification are adopted only to distinguish one entity or operation from another entity or operation and not always to require or imply existence of any such practical relationship or sequence between the entities or operations. Furthermore, terms "include" and "contain" or any other variant thereof is intended to cover nonexclusive inclusions herein, so that a process, method, object or device including a series of elements not only includes those elements but also includes other elements which are not clearly listed or further includes elements intrinsic to the process, the method, the object or the device. Under the condition of no more limitations, an element defined by the statement "including a/an . . . " does not exclude existence of the same other elements in a process, method, object or device including the element.

What is claimed is:

1. A resistance compensation device for a storage chip, wherein the resistance compensation device has a compensation resistor array structure composed of a plurality of compensation resistors and a plurality of compensation circuit switches;

the compensation resistor array structure is arranged between a bit cell power output end of the storage chip and a preset power supply end of a bit cell array of the storage chip;

wherein the plurality of the compensation circuit switches are arranged corresponding to bit cells in the bit cell array; and the compensation circuit switch and the bit cell correspondingly are synchronously gated and synchronously turned off, so as to synchronously change a total resistance value of the compensation resistor array structure to perform corresponding resistance compensation on the bit cell which is gated, wherein compensation resistor traces are sequentially connected in series into two or more metal wires; and the metal wires are connected to each other through the plurality of the compensation circuit switches, wherein the number of the metal wires is specifically two.

2. The resistance compensation device according to claim 1, wherein the compensation circuit switch and the bit cell correspondingly are synchronously gated and synchronously turned off, so as to synchronously change the total resistance value of the compensation resistor array structure to perform the corresponding resistance compensation on the bit cell which is gated specifically comprises:

the compensation circuit switch and the bit cell correspondingly are synchronously gated and synchronously turned off, so that the total trace resistance from the bit cell power output end to the bit cell which is gated is consistent in a case that the bit cell is selected.

3. The resistance compensation device according to claim 1, wherein the plurality of the compensation circuit switches are in one-to-one correspondence with gating signal lines of the bit cell array.

4. The resistance compensation device according to claim 3, wherein the bit cell array is specifically a two-dimensional array, and the gating signal lines specifically comprise x+1 bit lines in a direction of a horizontal axis and y+1 word lines in a direction of a vertical axis;

from the bit cell power output end, the plurality of the compensation circuit switches corresponding to the bit lines are sequentially connected between the two metal lines according to an arrangement order opposite to that of the bit lines from the bit cell power output end; and from the bit cell power output end, the plurality of the compensation circuit switches corresponding to the word lines are sequentially connected between the two metal lines according to an arrangement order opposite to that of the word lines from the bit cell power output end;

wherein x and y are positive integers, and in a direction of a same axis, a sum of resistance values of two sections of the compensation resistor traces between any two of the plurality of the compensation circuit switches is equal to a trace resistance value between two of the gating signal lines correspondingly.

5. The resistance compensation device according to claim 4, wherein each of the plurality of the compensation circuit switches is connected to a control end of the gating signal line correspondingly.

6. The resistance compensation device according to claim 4, wherein the resistance compensation device further comprises a first decoder, a second decoder, a third decoder, and a fourth decoder;

an input end of the first decoder and an input end of the second decoder are connected to a same set of bit line control pins, an output end of the first decoder is connected to a bit line gating switch of each of the bit lines, an output end of the second decoder is connected to the compensation circuit switch corresponding to each of the bit lines, and a control signal decoding sequence output by the second decoder is opposite to that of the first decoder; and an input end of the third decoder and an input end of the fourth decoder are connected to a same set of word line control pins, an output end of the third decoder is connected to a word line gating switch of each of the word lines, an output end of the fourth decoder is connected to the compensation circuit switch corresponding to each of the word lines, and a control signal decoding sequence output by the fourth decoder is opposite to that of the third decoder.

7. The resistance compensation device according to claim 1, wherein the compensation circuit switch is specifically a Metal Oxide Semiconductor (MOS) transistor.

8. The resistance compensation device according to claim 1, wherein the bit cell power output end is specifically an output end of a linear regulator or an output end of an operational amplifier; and a voltage provided by the bit cell power output end is specifically a read operation voltage to the bit cell array or a write operation voltage to the bit cell array.

9. The resistance compensation device according to claim 8, wherein the linear regulator is a Low Dropout Regulator (LDO).

10. The resistance compensation device according to claim 1, wherein material of the compensation resistor trace is same as material of a metal wire in the bit cell array, a length of the compensation resistor trace is arranged to be consistent to a length of a single section of the gating signal line, and a cross-sectional area of the compensation resistor trace is 2 times a cross-sectional area of the single section of the gating signal line.

11. The resistance compensation device according to claim 1, wherein in a case that the bit cell array is a two-dimensional array, the number of the compensation circuit switches is equal to a sum of the number of bit lines and the number of word lines; in a case that the bit cell array is a three-dimensional array, the number of the compensation circuit switches is a sum of the number of the bit lines and the number of the word lines plus the number of gating signal lines in a direction of a vertical axis.

12. A storage chip, comprising a resistance compensation device, wherein the resistance compensation device has a compensation resistor array structure composed of a plurality of compensation resistors and a plurality of compensation circuit switches;

the compensation resistor array structure is arranged between a bit cell power output end of the storage chip and a preset power supply end of a bit cell array of the storage chip;

wherein the plurality of the compensation circuit switches are arranged corresponding to bit cells in the bit cell array; and the compensation circuit switch and the bit cell correspondingly are synchronously gated and synchronously turned off, so as to synchronously change a total resistance value of the compensation resistor array structure to perform corresponding resistance compensation on the bit cell which is gated, wherein compensation resistor traces are sequentially connected in series into two or more metal wires; and the metal wires are connected to each other through the plurality of the compensation circuit switches, wherein the number of the metal wires is specifically two.

13. The storage chip according to claim 12, wherein the compensation circuit switch and the bit cell correspondingly are synchronously gated and synchronously turned off, so as to synchronously change the total resistance value of the compensation resistor array structure to perform the corresponding resistance compensation on the bit cell which is gated specifically comprises:

the compensation circuit switch and the bit cell correspondingly are synchronously gated and synchronously turned off, so that the total trace resistance from the bit cell power output end to the bit cell which is gated is consistent in a case that the bit cell is selected.

14. The storage chip according to claim 12, wherein the plurality of the compensation circuit switches are in one-to-one correspondence with gating signal lines of the bit cell array.

15. The storage chip according to claim 14, wherein the bit cell array is specifically a two-dimensional array, and the gating signal lines specifically comprise x+1 bit lines in a direction of a horizontal axis and y+1 word lines in a direction of a vertical axis;

from the bit cell power output end, the plurality of the compensation circuit switches corresponding to the bit lines are sequentially connected between the two metal lines according to an arrangement order opposite to that of the bit lines from the bit cell power output end; and from the bit cell power output end, the plurality of the compensation circuit switches corresponding to the word lines are sequentially connected between the two metal lines according to an arrangement order opposite to that of the word lines from the bit cell power output end;

wherein x and y are positive integers, and in a direction of a same axis, a sum of resistance values of two sections of the compensation resistor traces between any two of the plurality of the compensation circuit switches is equal to a trace resistance value between two of the gating signal lines correspondingly.

16. A resistance compensation method for a storage chip, applied to a compensation resistor array structure composed of a plurality of compensation resistors and a plurality of compensation circuit switches, the compensation resistor array structure being arranged between a bit cell power output end of the storage chip and a preset power supply end of a bit cell array of the storage chip, the plurality of the compensation circuit switches being arranged corresponding to bit cells in the bit cell array, and the resistance compensation method comprising:

in a case that a first control signal of the bit cell is generated, generating a second control signal of the compensation circuit switch corresponding to the bit cell; and synchronously sending the first control signal and the second control signal to perform corresponding resistance compensation on the bit cell which is gated by a total resistance value of the compensation resistor array structure controlled by the second control signal, wherein compensation resistor traces are sequentially connected in series into two or more metal wires; and the metal wires are connected to each other through the plurality of the compensation circuit switches, wherein the number of the metal wires is specifically two.

* * * * *